(12) United States Patent
Choi et al.

(10) Patent No.: US 12,156,400 B2
(45) Date of Patent: Nov. 26, 2024

(54) SEMICONDUCTOR INTEGRATED CIRCUIT DEVICE AND METHOD OF PROVIDING BIAS POWER TO THE SAME

(71) Applicant: SAMSUNG ELECTRONICS CO., LTD., Suwon-si (KR)

(72) Inventors: Hoonsung Choi, Seoul (KR); Jiyoung Yun, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 409 days.

(21) Appl. No.: 17/740,635

(22) Filed: May 10, 2022

(65) Prior Publication Data

US 2023/0096886 A1 Mar. 30, 2023

(30) Foreign Application Priority Data

Sep. 29, 2021 (KR) ........................ 10-2021-0128787

(51) Int. Cl.
*H01L 27/112* (2006.01)
*H10B 20/20* (2023.01)

(52) U.S. Cl.
CPC .................................. *H10B 20/20* (2023.02)

(58) Field of Classification Search
CPC ........ H10B 20/20; H10B 20/25; G11C 17/16; G11C 17/18; G11C 17/165; H01L 23/5252; H01L 23/5286; H01L 23/5386; H01L 27/0207

See application file for complete search history.

(56) References Cited

U.S. PATENT DOCUMENTS

| | | | |
|---|---|---|---|
| 7,687,864 B2 | 3/2010 | Yamamoto | |
| 7,882,476 B2 | 2/2011 | Itaka et al. | |
| 8,522,188 B2 | 8/2013 | Kim et al. | |
| 9,923,527 B2 | 3/2018 | McKay | |
| 10,739,807 B2 | 8/2020 | Lallement et al. | |
| 2009/0184350 A1* | 7/2009 | Kodama | H10B 20/00 257/E29.345 |
| 2019/0280108 A1* | 9/2019 | Toh | H01L 29/66795 |
| 2020/0051987 A1* | 2/2020 | Wang | H10B 20/25 |

FOREIGN PATENT DOCUMENTS

JP 2020072224 A 5/2020

\* cited by examiner

*Primary Examiner* — Mohammed R Alam
(74) *Attorney, Agent, or Firm* — Sughrue Mion, PLLC

(57) ABSTRACT

A semiconductor integrated circuit device includes a standard cell on a substrate, an one time programmable (OTP) memory structure at an edge portion of the standard cell, and a program transistor outside of the standard cell at a position adjacent to the edge portion of the standard cell at which the OTP memory structure is provided, the program transistor being electrically connected to the OTP memory structure. The OTP memory structure includes a first anti-fuse and a second anti-fuse. When a program voltage is applied to the program transistor and a bias power voltage is applied to the OTP memory structure, each of the first anti-fuse and the second anti-fuse becomes shorted and the bias power voltage is provided to the standard cell.

20 Claims, 7 Drawing Sheets

SEMICONDUCTOR INTEGRATED CIRCUIT DEVICE AND METHOD OF PROVIDING BIAS POWER TO THE SAME

CROSS-REFERENCE TO RELATED APPLICATION

This application claims priority under 35 U.S.C. § 119 to Korean Patent Application No. 10-2021-0128787, filed on Sep. 29, 2021 in the Korean Intellectual Property Office (KIPO), the disclosure of which is incorporated by reference herein in its entirety.

BACKGROUND

Example embodiments consistent with the present disclosure relate to a semiconductor integrated circuit device and a method of providing bias power to the same.

In a related art semiconductor integrated circuit device, in order to selectively provide bias power to a body or a well of a standard cell, a body bias generator (BBGen) has to be formed, which may occupy a large area and consume high electric power. Thus, it is desired to enhance a method of providing bias power to the body or well of the standard cell so that the integration degree may be enhanced and the power consumption may be reduced.

SUMMARY

It is an aspect to provide a semiconductor integrated circuit device having enhanced electrical characteristics.

It is another aspect to provide a method of providing bias power to the semiconductor integrated device having enhanced electrical characteristics.

According to an aspect of one or more example embodiments, there is provided a semiconductor integrated circuit device. The semiconductor integrated circuit device may include first and second wells doped with impurities having different conductivity types from each other in a substrate, a program transistor including a first gate structure on the first well and first and second impurity regions in upper portions of the first well adjacent to the first gate structure, and an one time programmable (OTP) memory structure including first and second anti-fuses on the second well. The second anti-fuse may include a filling oxide layer on the second well. The first anti-fuse may include a semiconductor layer on the filling oxide layer and a second gate structure on the semiconductor layer. The second gate structure may include a gate insulation pattern and a gate electrode on the gate insulation pattern. Third and fourth impurity regions may be formed in portions of the semiconductor layer adjacent to the second gate structure. The second and third impurity regions may be electrically connected with each other.

According to another aspect of one or more example embodiments, there is provided a semiconductor integrated circuit device. The semiconductor integrated circuit device may include first and second wells doped with impurities having different conductivity types from each other in a substrate, a first filling oxide layer on the first well, a first semiconductor layer on the first filling oxide layer, a program transistor including a first gate structure on the first semiconductor layer and first and second impurity regions in upper portions of the first semiconductor layer adjacent to the first gate structure, a second filling oxide layer on the second well, a second semiconductor layer on the second filling oxide layer, and a first anti-fuse including a second gate structure on the second semiconductor layer and third and fourth impurity regions in upper portions of the second semiconductor layer adjacent to the second gate structure. The second and third impurity regions may be electrically connected with each other.

According to yet another aspect of one or more example embodiments, there is provided a semiconductor integrated circuit device. The semiconductor integrated circuit device may include first and second wells doped with impurities having different conductivity types from each other in a substrate, a program transistor including a first gate electrode and first and second source/drain regions in the first well, a first anti-fuse, and a second anti-fuse between the first anti-fuse and the second well. The second source/drain region is electrically connected to each of the first anti-fuse and the second anti-fuse, and when a selection voltage is applied to the first gate electrode, a program voltage is applied to the first source/drain region, and a bias power voltage is applied to the second anti-fuse, each of the first anti-fuse and the second anti-fuse becomes shorted and the bias power voltage is provided to the second well.

According to example embodiments of the inventive concept, there is a semiconductor integrated circuit device. The semiconductor integrated circuit device may include a standard cell on a substrate; an one time programmable (OTP) memory structure at an edge portion of the standard cell, the OTP memory structure including a first anti-fuse and a second anti-fuse; and a program transistor outside of the standard cell at a position adjacent to the edge portion of the standard cell at which the OTP memory structure is provided, the program transistor being electrically connected to the OTP memory structure, wherein when a program voltage is applied to the program transistor and a bias power voltage is applied to the OTP memory structure, each of the first anti-fuse and the second anti-fuse becomes shorted and the bias power voltage is provided to the standard cell.

According to yet another aspect of one or more example embodiments, there is provided a semiconductor integrated circuit device. The semiconductor integrated circuit device may include first and second wells doped with impurities having different conductivity types in a substrate, a program transistor including a first gate structure on the first well and first and second impurity regions at portions of the first well adjacent to the first gate structure, a filling oxide layer on the second well, a semiconductor layer on the filling oxide layer, a first anti-fuse including a gate insulation pattern on the semiconductor layer, a gate electrode on the gate insulation pattern and third and fourth impurity regions at portions of the semiconductor layer adjacent to the semiconductor layer, a first contact plug on and electrically connected to the first impurity region, a second contact plug on and electrically connected to the first gate structure, a third contact plug on and electrically connected to the second impurity region, a fourth contact plug on and electrically connected to the third impurity region, a fifth contact plug on and electrically connected to the gate electrode, and a wiring on and commonly electrically connected to the third and fourth contact plugs. The second well, the filling oxide layer and the semiconductor layer may form a second anti-fuse.

According to yet another aspect of one or more example embodiments, there is provided a method of providing bias power to a semiconductor integrated circuit device. The semiconductor integrated circuit device may include first and second wells doped with impurities having different conductivity types in a substrate, a program transistor including a first gate structure on the first well and first and second impurity regions in upper portions of the first well adjacent to the first gate structure, and an OTP memory structure including first and second anti-fuses on the second well. The second anti-fuse may include a filling oxide layer on the second well. The first anti-fuse may include a semiconductor layer on the filling oxide layer and a second gate structure including a gate insulation pattern and a gate electrode on the gate insulation pattern. Third and fourth impurity regions may be formed in portions of the semiconductor layer adjacent to the semiconductor layer. In the method, a selection voltage may be applied to the first gate structure. A program voltage may be applied to the first impurity region. A bias power voltage may be applied to the gate electrode. Thus, the bias power voltage may be provided to the second well.

According to yet another aspect of one or more example embodiments, there is provided a method of providing bias power to a semiconductor integrated circuit device. The semiconductor integrated circuit device may include a standard cell on a substrate; an one time programmable (OTP) memory structure at an edge portion of the standard cell, the OTP memory structure including a first anti-fuse and a second anti-fuse; and a program transistor outside of the standard cell at a position adjacent to the edge portion of the standard cell at which the OTP memory structure is provided, the program transistor being electrically connected to the OTP memory structure. In the method, a program voltage and a selection voltage may be applied to the program transistor. A bias power voltage may be applied to the OPT memory structure. Thus, the bias power voltage may be provided to the standard cell.

DETAILED DESCRIPTION

The above and other aspects will be more clearly understood by describing in detail exemplary embodiments thereof with reference to the accompanying drawings.

It will be understood that, although the terms "first," "second," and/or "third" may be used herein to describe various elements, components, regions, layers and/or sections, these elements, components, regions, layers and/or sections should not be limited by these terms. These terms are only used to distinguish one element, component, region, layer or section from another region, layer or section. Thus, a "first" element, component, region, layer or section discussed below could be termed a "second" or a "third" element, component, region, layer or section without departing from the teachings of the present disclosure.

In a semiconductor integrated circuit device in accordance with various example embodiments, a body bias generator (BBGen) for providing bias power to the body or well of the standard cell, which may occupy a large area and consume a large amount of power, may not be formed so that the semiconductor integrated circuit device may have enhanced integration degree and reduced power consumption. In other words, as an alternative to the BBGen, various example embodiments provide a novel structure, which provides an enhanced integration degree and reduced power consumption as compared with the BBGen.

Figure 1:
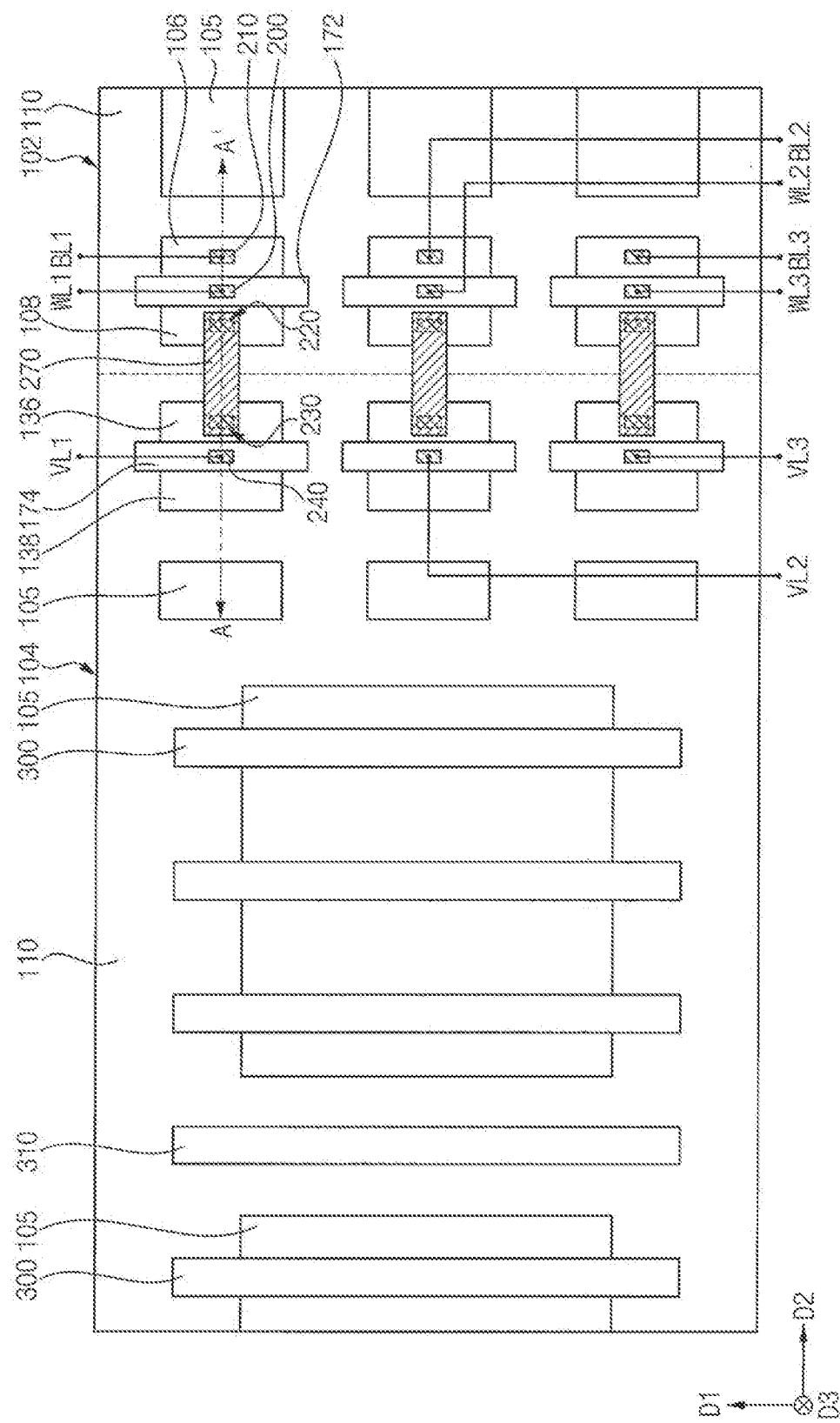
FIGS. 1 and 2 are a plan view and a cross-sectional view, respectively, illustrating a structure of a semiconductor integrated circuit device in accordance with example embodiments.
Figure 2:
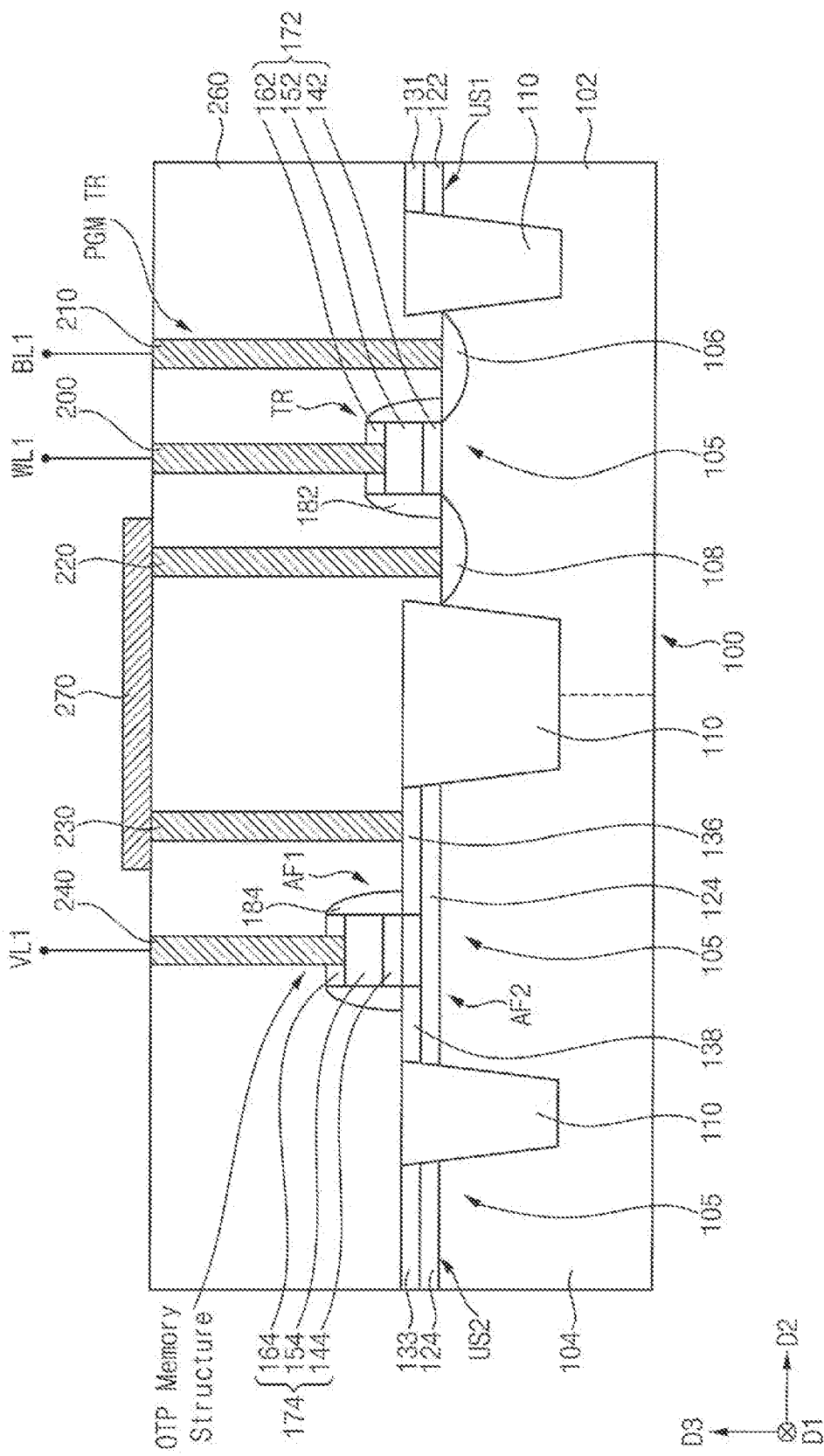
Figure 3:
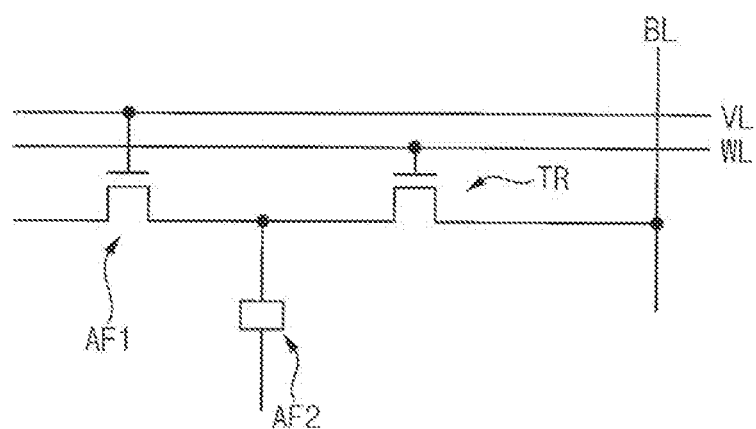
FIG. 3 is a circuit diagram illustrating an electric connection and an operating method of a member for providing bias power to a body or well of a standard cell in the semiconductor integrated circuit device, in accordance with example embodiments.

FIGS. 1 and 2 are a plan view and a cross-sectional view, respectively, illustrating a structure of a semiconductor integrated circuit device in accordance with example embodiments, and FIG. 3 is a circuit diagram illustrating an electric connection and an operating method of a member for providing bias power to a body or well of a standard cell in the semiconductor integrated circuit device, in accordance with example embodiments. FIG. 1 does not show an insulating interlayer 260, and FIG. 2 is a cross-sectional view of a boundary area between a first well 102 and a second well 104. FIG. 2 illustrates a cross-sectional view along A-A' in FIG. 1.

Referring to FIGS. 1 and 2, the semiconductor integrated circuit device may include a standard cell on a substrate 100, and an one time programmable (OTP) memory structure and a program transistor PGM TR for providing bias power to a body or a well of the standard cell.

In example embodiments, the substrate 100 may be a silicon-on-insulator (SOI) substrate or a germanium-on-insulator (GOI) substrate.

A first well 102 and a second well 104 may be formed in the substrate 100. In example embodiments, the first well 102 may be a p-type well P-WELL doped with p-type impurities, and the second well 104 may be an n-type well N-WELL doped with n-type impurities.

In example embodiments, a plurality of second wells 104 may be spaced apart from each other in a first direction D1 substantially parallel to an upper surface of the substrate 100, and the first well 102 may be formed between the second wells 104 disposed in the first direction D1, and at each of opposite sides of the second well 104 in a second direction D2 substantially parallel to the upper surface of the substrate 100 and substantially perpendicular to the first direction D1. FIGS. 1 and 2 show a portion of the second well 104, and a portion of the first well 102 at a side of the second well 104 in the second direction D2.

In example embodiments, the standard cell including various transistors may be formed on each of the first and second wells 102 and 104 alternately and repeatedly disposed in the first direction D1, the OTP memory structure for providing bias power to the body or well of the standard cell may be formed at an edge of the standard cell in the second direction D2, and the program transistor PGM TR may be formed on a portion of the first well 102 adjacent to the OTP memory structure in the second direction D2. In example embodiments, a plurality of OTP memory structures may be spaced apart from each other in the first direction D1 in each standard cell, and the program transistor PGM TR may be formed on the first well 102 to be electrically connected to each of the plurality of OTP memory structures. FIG. 1 shows three OTP memory structures spaced apart from each other in the first direction D1 in the standard cell corresponding to three program transistors PGM TR. However, example embodiments are not be limited thereto and, in some example embodiments, more or fewer the three OTP memory structure and more or fewer than three program transistors PGM TR may be provided.

An isolation pattern 110 may be formed on the substrate 100, and thus an active region 105 on which no isolation pattern is formed may be defined in the substrate 100. Upper portions of the first and second wells 102 and 104 may be separated from each other by the isolation pattern 110. Additionally, the upper portion of the first well 102 may be divided by the isolation pattern 110, and the upper portion of the second well 104 may be divided by the isolation pattern 110. The isolation pattern 110 may include an oxide, e.g., silicon oxide.

A first filling oxide layer 122 and a first semiconductor layer 131 may be stacked on an upper surface US1 of the first well 102, and a second filling oxide layer 124 and a second semiconductor layer 133 may be stacked on an upper surface US2 of the second well 104. Each of the first and second filling oxide layers 122 and 124 may include an oxide, e.g., silicon oxide, and each of the first and second semiconductor layers 131 and 133 may include a crystalline silicon, e.g., single crystalline silicon or polysilicon.

In example embodiments, the first and second filling oxide layers 122 and 124 may have substantially the same thickness, and the first and second semiconductor layers 131 and 133 may include substantially the same thickness. In some example embodiments, upper surfaces of the first and second filling oxide layers 122 and 124 may be coplanar, and upper surfaces of the first and second semiconductor layers 131 and 133 may be coplanar.

As illustrated in the example of FIG. 2, the program transistor PGM TR may include a first gate structure 172 on a portion of the first well 102 adjacent to the second well 104 in the second direction D2, and a first impurity region 106 and a second impurity region 108 at upper portions (e.g., adjacent to the upper surface US1) of the first well 102 adjacent to the first gate structure 172. A lower surface of the first gate structure 172 may be lower than an upper surface of the isolation pattern 110.

The first gate structure 172 may include a first gate insulation pattern 142, a first gate electrode 152 and a first gate mask 162 sequentially stacked on the upper surface US1 of the first well 102, and a first spacer 182 may be formed on a sidewall of the first gate structure 172. The first gate electrode 152 may serve as a gate of the program transistor PGM TR.

The first gate insulation pattern 142 may include an oxide, e.g., silicon oxide, the first gate electrode 152 may include a conductive material, e.g., doped polysilicon, a metal, a metal nitride, a metal silicide, etc., and the first gate mask 162 and the first spacer 182 may include a nitride, e.g., silicon nitride.

In example embodiments, each of the first and second impurity regions 106 and 108 may include impurities having a conductivity type opposite to that of the first well 102, that is, n-type impurities, and each of the first and second impurity regions 106 and 108 may serve as a source/drain of the program transistor PGM TR. Thus, the program transistor PGM TR may be an NMOS transistor.

The OTP memory structure may include a first anti-fuse AF1 and a second anti-fuse AF2 on an edge portion of the second well 104 of the substrate 100 in the second direction D2.

The second anti-fuse AF2 may include the second filling oxide layer 124 between the second well 104 and the second semiconductor layer 133. Alternatively, the second anti-fuse AF2 may be defined to include not only the second filling oxide layer 124 but also a portion of the second semiconductor layer 133 that overlies the second filling oxide layer 124 and/or a portion of the second well 104 that underlies the second filling oxide layer 124.

The first anti-fuse AF1 may include the second semiconductor layer 133 and a second gate structure 174. The second gate structure 174 may include a second gate insulation pattern 144, a second gate electrode 154 and a second gate mask 164 sequentially stacked on the upper surface US2 of the second well 104, and a second spacer 184 may be formed on a sidewall of the second gate structure 174.

Impurities having a conductivity type that is the same as that of the second well 104, that is, n-type impurities, may be doped into portions of the second semiconductor layer 133 at opposite sides of the second gate structure 174 to form a third impurity region 136 and a fourth impurity region 138, and each of the third and fourth impurity regions 136 and 138 may serve as a source/drain of the first anti-fuse AF1.

The insulating interlayer 260 may be formed on the substrate 100 having the first and second filling oxide layers 122 and 124 and the first and second semiconductor layers 131 and 133 to cover the first and second gate structures 172 and 174 and the first and second spacers 182 and 184. The insulating interlayer 260 may include an oxide, e.g., silicon oxide.

A first contact plug 200 extending through the insulating interlayer 260 and the first gate mask 162 to contact an upper surface of the first gate electrode 152, a second contact plug 210 and a third contact plug 220 extending through the insulating interlayer 260 to contact upper surfaces of the first and second impurity regions 106 and 108, respectively, a fourth contact plug 230 extending through the insulating interlayer 260 to contact an upper surface of the third impurity region 136, and a fifth contact plug 240 extending through the insulating interlayer 260 and the second gate mask 164 to contact an upper surface of the second gate electrode 154 may be formed. A wiring 270 may be formed on the upper surface of the insulating interlayer 260 and on the third and fourth contact plugs 220 and 230, and may commonly contact upper surfaces of the third and fourth contact plugs 220 and 230 to electrically connect the third and fourth contact plugs 220 and 230 with each other.

The first to fifth contact plugs 200, 210, 220, 230 and 240 and the wiring 270 may include a conductive material, e.g., a metal, a metal nitride, a metal silicide and/or doped polysilicon.

The standard cells on the first and second wells 102 and 104, respectively, disposed in the first direction D1 may include various transistors. For example, FIG. 1 shows some of the transistors on the second well 104. Each of the transistors may include a third gate structure 300 on the active region 105 and/or a fourth gate structure 310 on the isolation pattern 110, and an impurity region (not shown) may be formed at an upper portion of the active region 105 adjacent to the third gate structure 300, and may serve as a source/drain.

Referring to FIGS. 1 to 3, the first contact plug 200 contacting the first gate electrode 152 included in each program transistor PGM TR may be electrically connected to a corresponding one of a first word line WL1, a second word line WL2, and a third word line WL3, the second contact plug 210 contacting the first impurity region 106 in each program transistor PGM TR may be electrically connected to a corresponding one of a first bit line BL1, a second bit line BL2, and a third bit line BL3, and the fifth contact plug 240 contacting the second gate electrode 154 of the first anti-fuse AF1 included in each OTP memory structure may be electrically connected to a corresponding one of a first voltage line VL1, a second voltage line VL2, and a third voltage line VL3. The third contact plug 220 contacting the second impurity region 108 included in each program transistor PGM TR may be electrically connected to the fourth contact plug 230 contacting the third impurity region 136 of the first anti-fuse AF1 included in a corresponding OTP memory structure through the wiring 270.

Thus, the first gate electrode 152 of each program transistor PGM TR may be connected to a corresponding one of the word lines WL1, WL2 and WL3, and the drain region 106 of each program transistor PGM TR may be connected to a corresponding one of the bit lines BL1, BL2 and BL3. The source region 108 of each program transistor PGM TR may be connected to the third impurity region 136 of the first anti-fuse AF1 included in a corresponding OTP memory structure, which may be formed on the second well 104. The third impurity region 136 and the second well 104 may be connected with each other through the second anti-fuse AF2, and the second gate electrode 154 of the first anti-fuse AF1 included in each OTP memory structure may be connected to a corresponding one of the voltage lines VL1, VL2 and VL3.

Hereinafter, a method of providing bias power to the body or well of each standard cell using the OTP memory structures and the program transistors PGM TRs is illustrated. A method of providing bias power through the first word line WL1, the second bit line BL2 and the first voltage line VL1 is illustrated.

A program voltage may be applied to the first bit line BL1, a selection voltage having a voltage level higher than that of a threshold voltage of the program transistor PGM TR may be applied to the first word line WL1, and a bias power voltage may be applied to the first voltage line VL1. In example embodiments, a voltage difference between the program voltage and the bias power voltage may be greater than a breakdown voltage of the second gate insulation pattern 144, and the program voltage may be greater than a breakdown voltage of the second filling oxide layer 124.

For example, each of the program voltage and the selection voltage may be set to 5V, and the bias power voltage may be set to 0V, 0.9V, 1.8V, etc. The breakdown voltages of the second gate insulation pattern 144 and the second filling oxide layer 124 may be 1V and 2V, respectively. However, these specific values of the program voltage, the selection voltage and the bias power voltage are illustrative, and the program voltage, the selection voltage and the bias power voltage may be varied according to the bias power voltage to be provided to the standard cell, the breakdown voltages of the second gate insulation pattern 144 and the second filling oxide layer 124, and the threshold voltage of the program transistor PGM TR.

When the program voltage is applied to the first bit line BL1 and the program transistor PGM TR is turned on, a voltage difference between the program voltage and the bias power voltage is greater than the breakdown voltage of the second gate insulation pattern 144 included in the first anti-fuse AF1 so that the first anti-fuse AF1 may be shorted, and the program voltage is greater than the breakdown voltage of the second filling oxide layer 124 included in the second anti-fuse AF2 so that the second anti-fuse AF2 may also be shorted. Accordingly, the bias power voltage applied by the first voltage line VL1 may be provided to the second well 104 of the standard cell as the OTP memory structures including the first and second anti-fuses AF1 and AF2 are programmed.

As illustrated above, a plurality of OTP memory structures each including the first and second anti-fuses AF1 and AF2 may be formed in each standard cell, and the program transistors PGM TRs may be formed at an area adjacent to the standard cell. Thus, when the semiconductor integrated circuit device is manufactured, the OTP memory structures connected to the first to third voltage lines VL1, VL2 and VL3, respectively, which may apply bias power voltages of, e.g., 0V, 0.9V and 1.8V, respectively, and the program transistors PGM TRs connected to the OTP memory structures may be formed, and only one of the program transistors PGM TRs may be selected and the OTP memory structure may be programmed by the above-mentioned method, so that a desired bias power voltage may be applied to the standard cell.

Accordingly, an additional body bias generator (BBGen) for providing bias power to the body or well of the standard cell, which may occupy a large area and consume a large amount of power, may be omitted, so that the semiconductor integrated circuit device may have an enhanced integration degree and a reduced power consumption.

Non-selected ones of the plurality of OTP memory structures, that is, ones of the plurality of OTP memory structures that are not programmed may be dummy transistors, and may remain in the standard cell.

The first and second wells 102 and 104 may be p-type and n-type wells, respectively, and each program transistor PGM TR and the first anti-fuse AF1 may be NMOS transistors. However, example embodiments are not be limited thereto. Thus, in some embodiments, the first and second wells 102 and 104 may be n-type and p-type wells, respectively, and each program transistor PGM TR and the first anti-fuse AF1 may be PMOS transistors.

Figure 4:
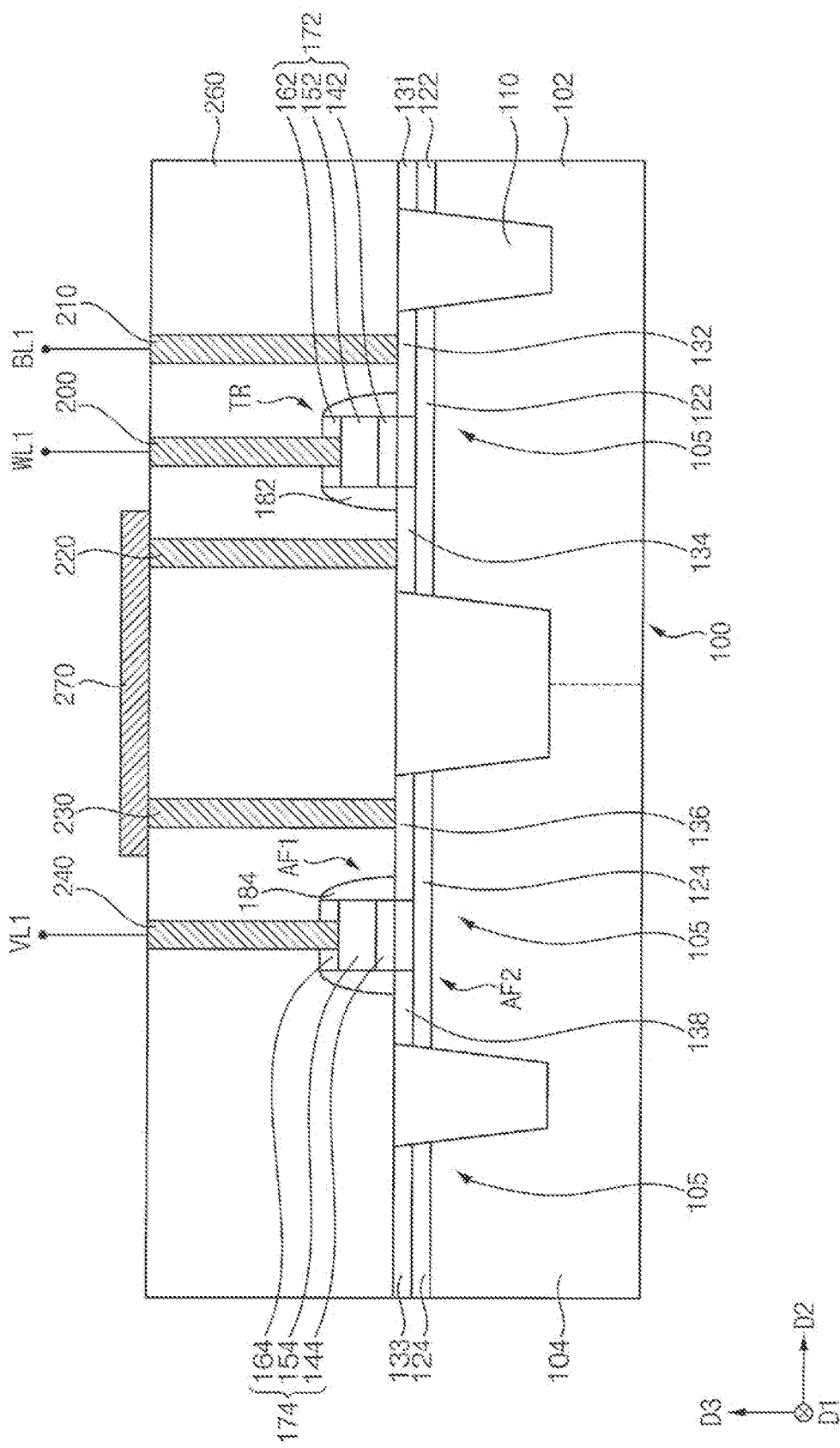
FIG. 4 is a cross-sectional view illustrating a structure of a semiconductor integrated circuit device in accordance with example embodiments.

FIG. 4 is a cross-sectional view illustrating a structure of a semiconductor integrated circuit device in accordance with example embodiments. The semiconductor integrated circuit device illustrated in FIG. 4 may be substantially the same as or similar to that of the semiconductor integrated circuit device illustrated with respect to FIGS. 1 to 3, except for the program transistor PGM TR, and thus, repeated explanations of the same or similar elements are omitted herein for conciseness.

Referring to FIG. 4, the first gate structure 172 included in the program transistor PGM TR may be formed on the first semiconductor layer 131 on the first well 102 of the substrate 100.

That is, the first gate structure 172 in the semiconductor integrated circuit device illustrated with reference to FIGS. 1 to 3 may not be formed on an upper surface of the first semiconductor layer 131 but may directly contact an upper surface of the first well 102, whereas the first gate structure 172 in the semiconductor integrated circuit device illustrated in FIG. 4 may directly contact an upper surface of the first semiconductor layer 131.

Thus, a fifth impurity region 132 and a sixth impurity region 134 may be formed at upper portions of the first semiconductor layer 131 adjacent to the first gate structure 172, and each of the fifth and sixth impurity regions 132 and 134 may serve as a source/drain of the program transistor PGM TR. Each of the fifth and sixth impurity regions 132 and 134 may be doped with impurities having a conductivity type opposite to that of the impurities doped in the first well 102, that is, n-type impurities.

The second and third contact plugs 210 and 220 may contact upper surfaces of the fifth and sixth impurity regions 132 and 134, respectively.

The program transistor PGM TR may be formed on the SOI substrate in the semiconductor integrated circuit device of FIG. 4, while the program transistor PGM TR may be formed on the bulk substrate in the semiconductor integrated circuit device of FIGS. 1 to 3. The program transistor PGM TR in the semiconductor integrated circuit device of FIGS. 1 to 3 may be formed on the bulk substrate by partially removing the first filling oxide layer 122 and the first semiconductor layer 131 on the first well 102 in the SOI substrate.

Figure 5:
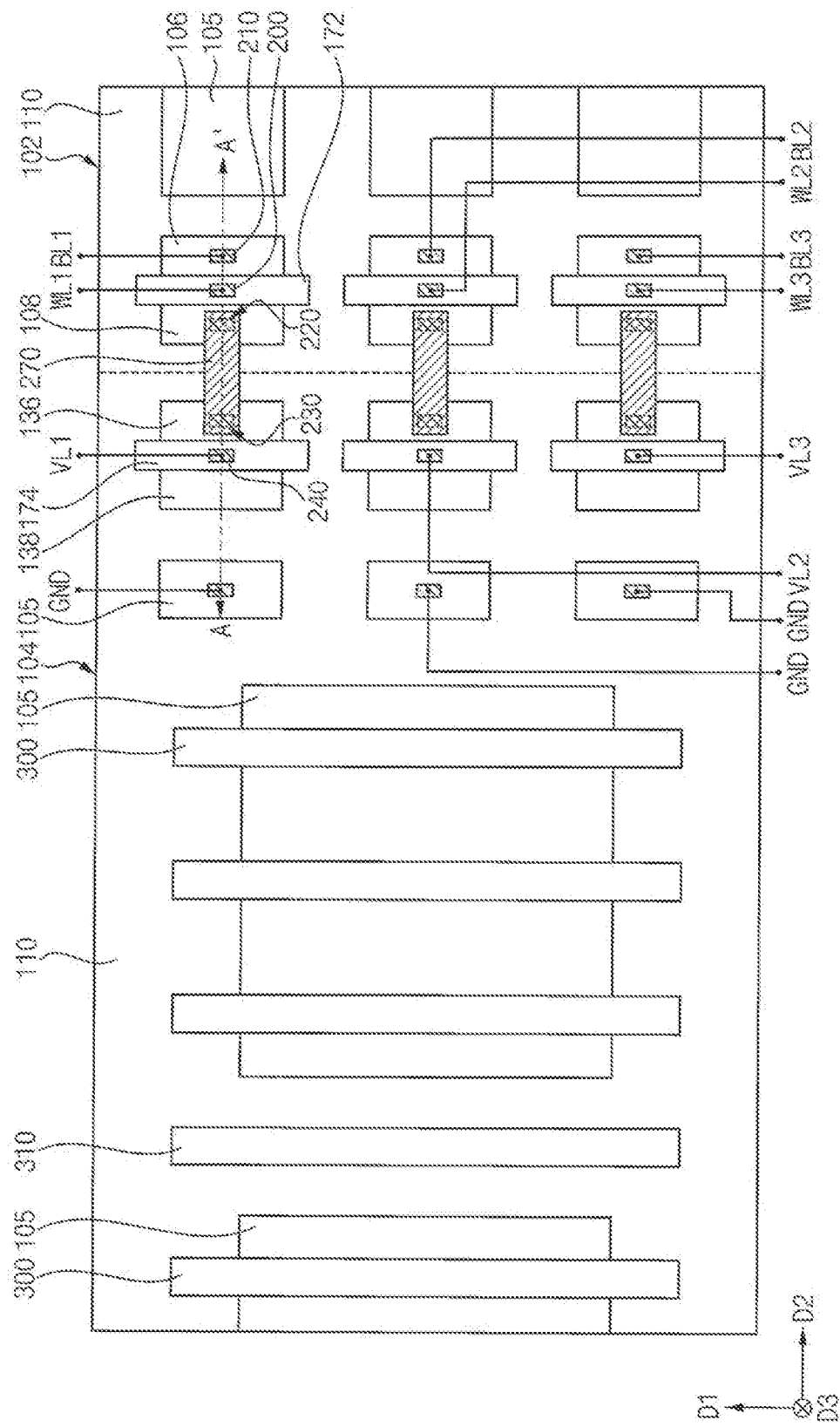
FIGS. 5 and 6 are a plan view and a cross-sectional view, respectively, illustrating a structure of a semiconductor integrated circuit device in accordance with example embodiments.
Figure 6:
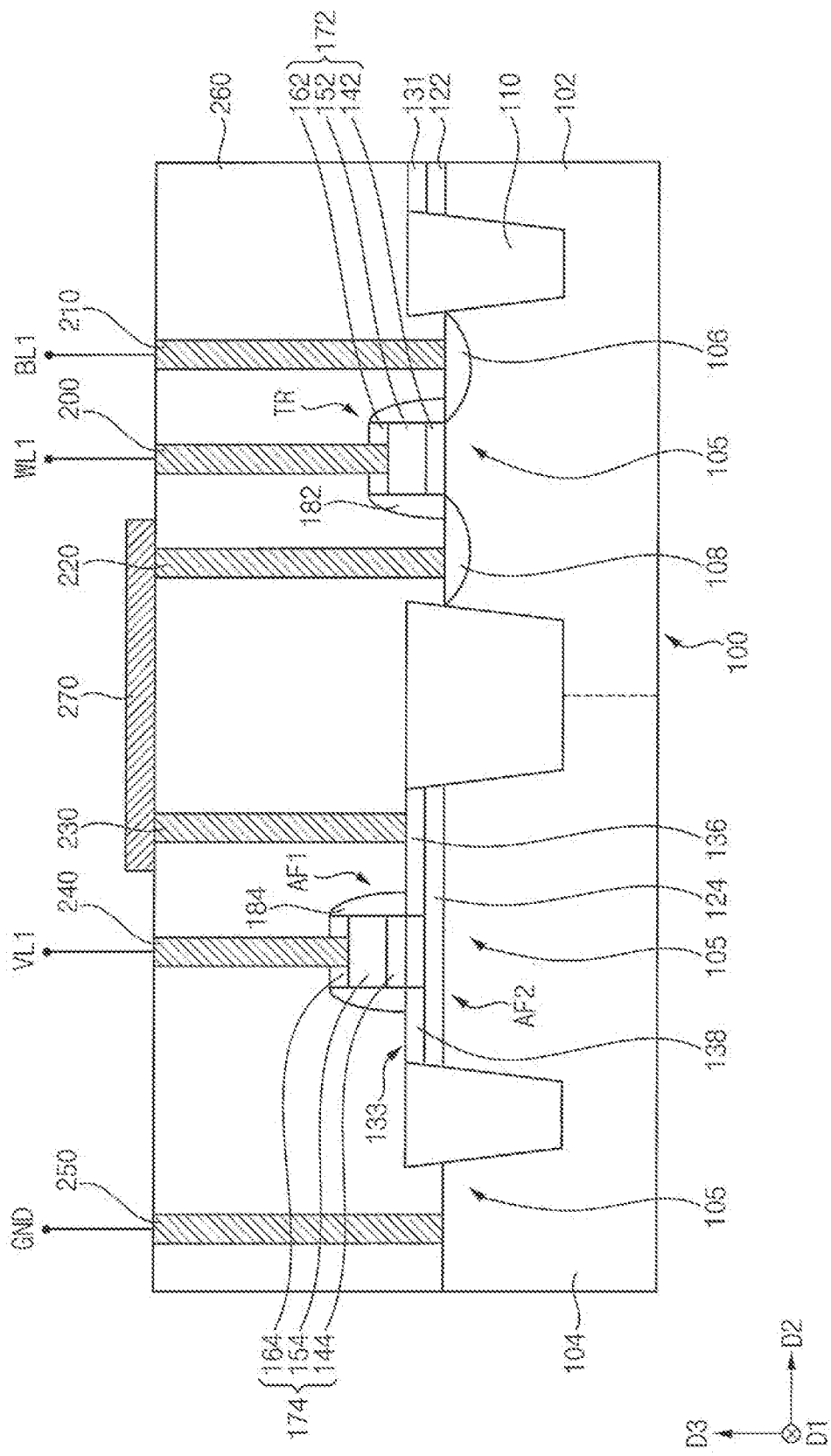
Figure 7:
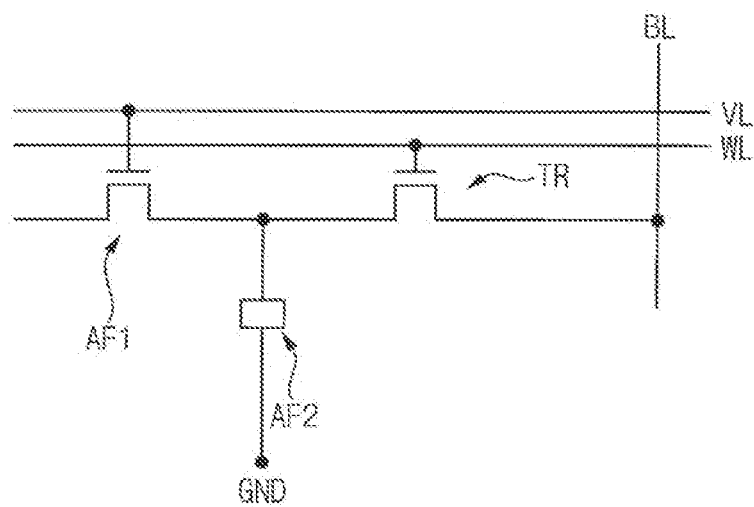
FIG. 7 is a circuit diagram illustrating an electric connection and an operating method of a member for providing bias power to a body or well of a standard cell in the semiconductor integrated circuit device, in accordance with example embodiments.

FIGS. 5 and 6 are a plan view and a cross-sectional view, respectively, illustrating a structure of a semiconductor integrated circuit device in accordance with example embodiments, and FIG. 7 is a circuit diagram illustrating electric connection and operating method of a member for providing bias power to a body or well of a standard cell in the semiconductor integrated circuit device, in accordance with example embodiments.

The semiconductor integrated circuit device illustrated in FIGS. 5-6 may be substantially the same as or similar to the semiconductor integrated circuit device of FIGS. 1 to 3, except for a ground electrode GND connected to the second well 104, and thus, repeated explanations of the same or similar elements are omitted herein for conciseness.

Referring to FIGS. 5 to 7, a sixth contact plug 250 may be formed through the insulating interlayer 260 to contact an upper surface of the second well 104, and a ground electrode GND may be electrically connected to the sixth contact plug 250.

Thus, when voltages are applied by the bit lines BL1, BL2 and BL3 and the voltage lines VL1, VL2 and VL3 in order that the first and second anti-fuses AF1 and AF2 may be shorted, the ground electrode GND may be further connected to the second anti-fuse AF2, so that floating may be prevented and the program operation may be more stably performed.

While various exemplary embodiments have been shown and described with reference to the drawings, it will be apparent to those of ordinary skill in the art that various modifications in form and details may be made thereto without departing from the spirit and scope of the present disclosure as set forth by the following claims.

What is claimed is:

1. A semiconductor integrated circuit device comprising:
a first well and a second well in a substrate, the first well and the second well being doped with impurities having different conductivity types from each other;
a program transistor including:
a first gate structure on the first well; and
a first impurity region and a second impurity region in upper portions of the first well adjacent to the first gate structure; and
an one time programmable (OTP) memory structure including a first anti-fuse and a second anti-fuse on the second well,
wherein the second anti-fuse includes a filling oxide layer on the second well,
wherein the first anti-fuse includes:
a semiconductor layer on the filling oxide layer;
a second gate structure on the semiconductor layer, the second gate structure including a gate insulation pattern, and a gate electrode on the gate insulation pattern,
wherein a third impurity region and a fourth impurity region are formed in portions of the semiconductor layer adjacent to the second gate structure, and
wherein the second impurity region and the third impurity region are electrically connected with each other.

2. The semiconductor integrated circuit device of claim 1, wherein the first impurity region is electrically connected to a bit line configured for applying a program voltage, the first gate structure is electrically connected to a word line configured for applying a selection voltage, and the gate electrode is electrically connected to a voltage line configured for applying a bias power voltage.

3. The semiconductor integrated circuit device of claim 2, wherein a difference between the program voltage and the bias power voltage is greater than a breakdown voltage of the gate insulation pattern.

4. The semiconductor integrated circuit device of claim 2, wherein the program voltage is greater than a breakdown voltage of the filling oxide layer.

5. The semiconductor integrated circuit device of claim 2, wherein the selection voltage is greater than a threshold voltage of the program transistor.

6. The semiconductor integrated circuit device of claim 2, wherein when the program voltage is applied to the bit line, the selection voltage is applied to the word line, and the bias power voltage is applied to the voltage line, each of the first anti-fuse and the second anti-fuse becomes shorted and the bias power voltage is provided to the second well.

7. The semiconductor integrated circuit device of claim 1, further comprising:
a first contact plug on and electrically connected to the first impurity region;
a second contact plug on and electrically connected to the first gate structure;
a third contact plug on and electrically connected to the second impurity region;
a fourth contact plug on and electrically connected to the third impurity region; and
a fifth contact plug on and electrically connected to the second gate structure.

8. The semiconductor integrated circuit device of claim 7, further comprising a wiring between the third contact plug and the fourth contact plug, the wiring contacting both of the third contact plug and the fourth contact plug,
wherein the second impurity region and the third impurity region are electrically connected with each other through the third contact plug, the fourth contact plug, and the wiring.

9. The semiconductor integrated circuit device of claim 1, wherein the OTP memory structure is one of a plurality of OTP memory structures on the second well, and the program transistor is one of a plurality of program transistors on the first well, the plurality of program transistors being electrically connected to the plurality of OTP memory structures, respectively.

10. The semiconductor integrated circuit device of claim 9, wherein the first impurity region of each of the plurality of program transistors is electrically connected to a corresponding bit line configured for applying a program voltage, the first gate structure of each of the plurality of program transistors is electrically connected to a corresponding word line configured for applying a selection voltage, and the gate electrode of each of the plurality of OTP memory structures is electrically connected to a corresponding voltage line configured for applying a bias power voltage, and
wherein the plurality of voltage lines electrically connected to the plurality of gate electrodes included in the plurality of OTP memory structures, respectively, apply bias power voltages having different voltage levels.

11. A semiconductor integrated circuit device comprising:
a first well and a second well in a substrate, the first well and the second well being doped with impurities having different conductivity types from each other;
a first filling oxide layer on the first well;
a first semiconductor layer on the first filling oxide layer;
a program transistor including:
 a first gate structure on the first semiconductor layer; and
 a first impurity region and a second impurity region in upper portions of the first semiconductor layer adjacent to the first gate structure;
a second filling oxide layer on the second well;
a second semiconductor layer on the second filling oxide layer; and
a first anti-fuse including:
 a second gate structure on the second semiconductor layer; and
 a third impurity region and a fourth impurity region in upper portions of the second semiconductor layer adjacent to the second gate structure,
wherein the second impurity region and the third impurity region are electrically connected with each other.

12. The semiconductor integrated circuit device of claim 11, wherein the first impurity region is electrically connected to a bit line configured for applying a program voltage, the first gate structure is electrically connected to a word line configured for applying a selection voltage, and the second gate structure is electrically connected to a voltage line configured for applying a bias power voltage.

13. The semiconductor integrated circuit device of claim 12, wherein the second gate structure includes a gate insulation pattern and a gate electrode stacked on the second semiconductor layer, and
 wherein a difference between the program voltage and the bias power voltage is greater than a breakdown voltage of the gate insulation pattern.

14. The semiconductor integrated circuit device of claim 13, wherein when the program voltage is applied to the bit line, the selection voltage is applied to the word line, and the bias power voltage is applied to the voltage line, each of the gate insulation pattern and the second filling oxide layer is broken down, the first anti-fuse becomes shorted, the second well, the second filling oxide layer and the second semiconductor layer become shorted, and the bias power voltage is provided to the second well.

15. The semiconductor integrated circuit device of claim 12, wherein the program voltage is greater than a breakdown voltage of the second filling oxide layer.

16. The semiconductor integrated circuit device of claim 12, wherein the selection voltage is greater than a threshold voltage of the program transistor.

17. A semiconductor integrated circuit device comprising:
a first well and a second well in a substrate, the first well and the second well being doped with impurities having different conductivity types from each other;
a program transistor on the first well, the program transistor including a first gate electrode and a first source/drain region and a second source/drain region;
a first anti-fuse; and
a second anti-fuse between the first anti-fuse and the second well,
wherein:
the second source/drain region is electrically connected to each of the first anti-fuse and the second anti-fuse,
when a selection voltage is applied to the first gate electrode, a program voltage is applied to the first source/drain region, and a bias power voltage is applied to the second anti-fuse, each of the first anti-fuse and the second anti-fuse becomes shorted and the bias power voltage is provided to the second well.

18. The semiconductor integrated circuit device of claim 17, wherein:
the second anti-fuse includes:
 a filling oxide layer on the second well; and
 a semiconductor layer on the filling oxide layer, and when the filling oxide layer is broken down, the second anti-fuse becomes shorted.

19. The semiconductor integrated circuit device of claim 18, wherein:
the first anti-fuse includes:
 a gate insulation pattern on the semiconductor layer;
 a second gate electrode on the gate insulation pattern; and
 a third source/drain region and a fourth source/drain region in portions of the semiconductor layer adjacent to the second gate electrode, and
when the gate insulation pattern is broken down, the first anti-fuse becomes shorted.

20. The semiconductor integrated circuit device of claim 19, wherein the second source/drain region and the third source/drain region are electrically connected with each other.

* * * * *